United States Patent
Wu et al.

(10) Patent No.: US 10,115,572 B2
(45) Date of Patent: Oct. 30, 2018

(54) METHODS FOR IN-SITU CHAMBER CLEAN IN PLASMA ETCHING PROCESSING CHAMBER

(71) Applicant: Applied Materials, Inc., Santa Clara, CA (US)

(72) Inventors: Banqiu Wu, San Jose, CA (US); Xiaoyi Chen, Foster City, CA (US); David Knick, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 58 days.

(21) Appl. No.: 15/006,966

(22) Filed: Jan. 26, 2016

(65) Prior Publication Data

US 2017/0213709 A1    Jul. 27, 2017

(51) Int. Cl.
*B44C 1/22* (2006.01)
*H01J 37/32* (2006.01)
*C23F 1/12* (2006.01)
*B08B 9/08* (2006.01)

(52) U.S. Cl.
CPC .......... *H01J 37/32862* (2013.01); *B08B 9/08* (2013.01); *C23F 1/12* (2013.01); *H01J 37/32082* (2013.01); *H01J 37/32816* (2013.01)

(58) Field of Classification Search
None
See application file for complete search history.

(56) References Cited

U.S. PATENT DOCUMENTS

| 5,660,682 | A | * | 8/1997 | Zhao | H01L 21/02063 134/1.2 |
|---|---|---|---|---|---|
| 6,905,972 | B2 | | 6/2005 | Oda | |
| 7,097,716 | B2 | | 8/2006 | Barnes et al. | |
| 7,270,761 | B2 | | 9/2007 | Wang et al. | |
| 7,709,161 | B2 | * | 5/2010 | Okubo | G03F 1/80 430/5 |
| 2004/0074869 | A1 | * | 4/2004 | Wang | C23F 4/00 216/63 |
| 2010/0101602 | A1 | * | 4/2010 | Deehan | B08B 7/0035 134/1.1 |

* cited by examiner

*Primary Examiner* — Roberts Culbert
(74) *Attorney, Agent, or Firm* — Patterson + Sheridan LLP

(57) ABSTRACT

Embodiments of the disclosure include methods for in-situ chamber cleaning a plasma processing chamber utilized for photomask plasma fabrication process. In one embodiment, a method for in-situ chamber cleaning after a plasma process includes supplying a cleaning gas mixture including at least an oxygen containing gas and a hydrogen containing gas into the plasma processing chamber, controlling the processing pressure at less than 2 millitorr, applying a RF source power to the processing chamber to form a plasma from the cleaning gas mixture, and cleaning the processing chamber in the presence of the plasma.

16 Claims, 3 Drawing Sheets

METHODS FOR IN-SITU CHAMBER CLEAN IN PLASMA ETCHING PROCESSING CHAMBER

BACKGROUND

Field

Embodiments of the present disclosure generally relate to methods and apparatus for in-situ cleaning a plasma processing chamber utilized to etch a substrate. Particularly, embodiments of the present disclosure relate to methods and apparatus for in-situ chamber cleaning a plasma processing chamber utilized to etch a substrate.

Description of the Related Art

The fabrication of microelectronics or integrated circuit devices typically involves a complicated process sequence requiring hundreds of individual steps performed on semi-conductive, dielectric and conductive substrates. Examples of these process steps include oxidation, diffusion, ion implantation, thin film deposition, cleaning, etching and lithography. Using lithography and etching (often referred to as pattern transfer steps) processes, a desired pattern is first transferred to a photosensitive material layer, e.g., a photoresist, and then to the underlying material layer during the subsequent etching process. In the lithographic step, a blanket photoresist layer is exposed to a radiation source through a reticle or photomask, which is typically formed in a metal-containing layer supported on a glass or quartz substrate, containing a pattern so that an image of the pattern is formed in the photoresist. By developing the photoresist in a suitable chemical solution, portions of the photoresist are removed, thus resulting in a patterned photoresist layer. With this photoresist pattern acting as a mask, the underlying material layer is exposed to a reactive environment, e.g., using dry etching, which results in the pattern being transferred to the underlying material layer.

An example of a commercially available photomask etch equipment suitable for use in advanced device fabrication is the TETRA® Photomask Etch System, available from Applied Materials, Inc., of Santa Clara, Calif. The metal-containing layers patterned by a plasma processing such as photomask plasma etching process offers good critical dimension control than conventional wet chemical etching in the fabrication of microelectronic devices. Plasma etching technology is widely applied in the semiconductor and thin film transistor-liquid crystal display (TFT-LCD) industry.

During dry etching photomasks in the plasma chamber, materials such as chromium (Cr), MoSi, quartz, SiON or Ta-based compounds may be deposited to form layers of etching by-products. After the etching process, etching by-products may accumulate and deposit on the inner wall of the chamber. For example, when dry etching a Cr layer disposed on the substrate, the etch by-products may predominantly be photoresist with Cr containing materials. Alternatively, when dry etching Ta, the etch by-products may predominantly be photoresist with Ta containing materials. When the deposited etch by-products reach a certain thickness, the by-products may peel off from the inner wall of the plasma chamber and contaminate the photomask by falling onto the photomask substrate, causing irreparable defects to the photomask.

Accordingly, in order to maintain cleanliness of the processing chamber, a periodic cleaning process is performed to remove the by-products from the processing chamber. By-products deposited on chamber components or chamber inner walls are periodically cleaned typically with highly reactive chemicals. Attack from the reactive species during processing and cleaning reduces the lifespan of the chamber components and increase service frequency. Additionally, flakes from the eroded parts of the chamber component, such as aluminum fluoride (AlF), may become a source of particulate contamination during substrate processing. Accordingly, it is important to remove the deposited etching by-products and clean the chamber components and inner walls without damaging the chamber components and inner walls.

Therefore, there is a need for an improved process for cleaning plasma chamber after etching for a semiconductor substrate or photomask fabrication.

SUMMARY

Embodiments of the disclosure include methods for in-situ chamber cleaning a plasma processing chamber utilized for a semiconductor substrate or a photomask plasma fabrication process. In one embodiment, a method for in-situ chamber cleaning after a plasma process includes supplying a cleaning gas mixture including at least an oxygen containing gas and a hydrogen containing gas into the plasma processing chamber, controlling the processing pressure at less than 2 millitorr. applying a RF source power to the processing chamber to form a plasma from the cleaning gas mixture, and cleaning the processing chamber in the presence of the plasma.

In another embodiment, a method for in-situ chamber cleaning includes performing a cleaning process in a processing chamber by supplying a cleaning gas mixture including at least an oxygen containing gas and a hydrogen containing gas into the plasma processing chamber, and removing metal residuals from the processing chamber using the cleaning gas mixture.

In yet embodiment, a method of an in-situ chamber cleaning method includes performing a cleaning process in a processing chamber after a metal etching process is performed in the processing chamber, wherein the cleaning process is performed by supplying a cleaning gas mixture including at least an oxygen containing gas and a hydrogen containing gas into the plasma processing chamber, and removing metal residuals from the metal etching process from the processing chamber, wherein the metal etching process comprises etching a Cr containing material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure provide methods and apparatus for in-situ cleaning a plasma processing chamber utilized to perform photomask plasma etching processes. In one example, the cleaning method utilizes a cleaning gas mixture that includes a hydrogen containing gas and an oxygen containing gas to remove residuals from the processing chamber. One example of the hydrogen containing gas used in the cleaning gas mixture is HCl and one example of the oxygen containing gas is $O_2$.

Figure 1:
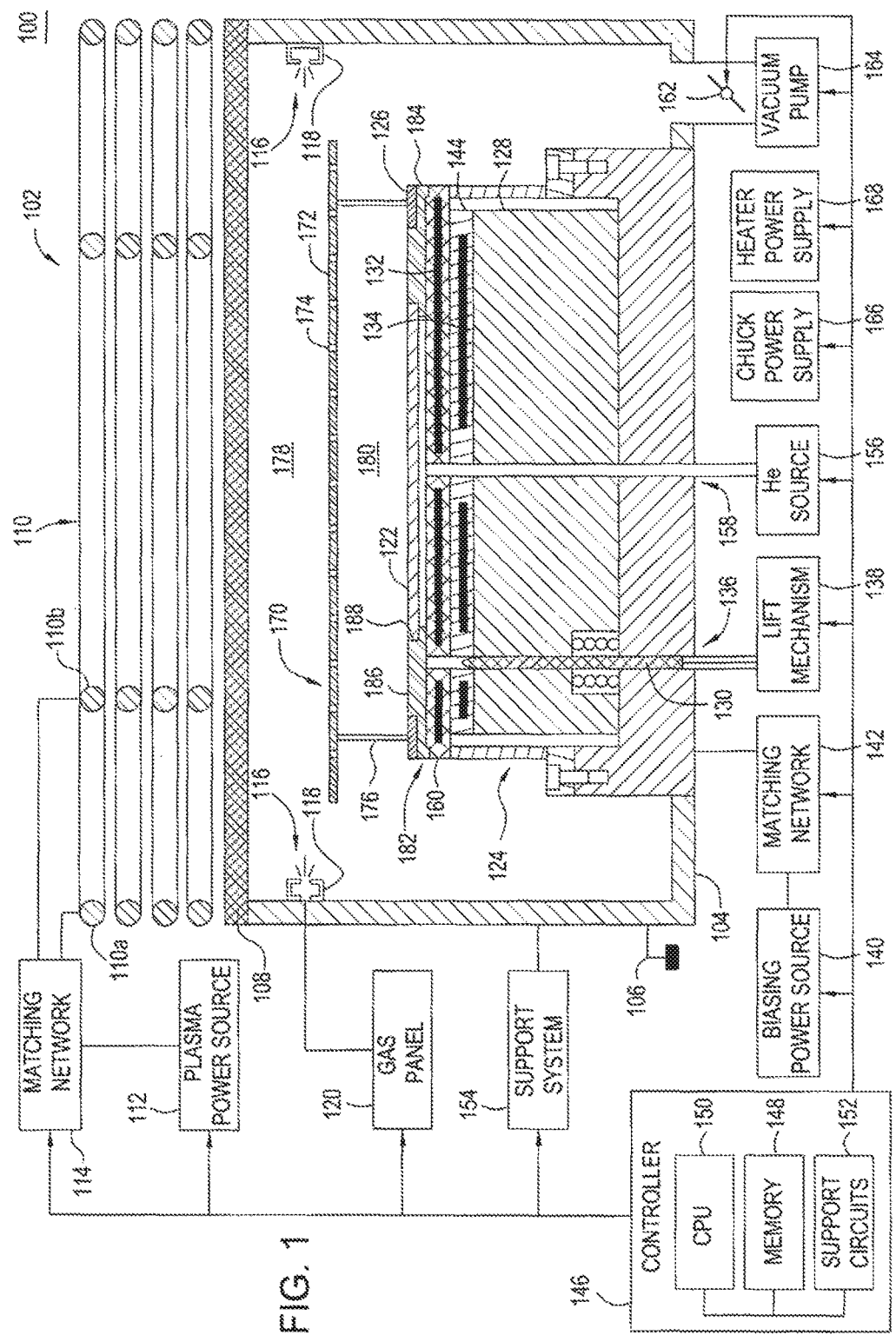
FIG. 1 depicts a schematic diagram of a plasma processing chamber for performing photomask plasma etching processes according to one embodiment of the disclosure.

FIG. 1 depicts a schematic diagram of an etch reactor 100 in which the disclosure may be practiced. Suitable reactors that may be adapted for use with the teachings disclosed herein include, for example, a Decoupled Plasma Source (DPS®II) reactor, or a TETRA® Photomask etch system, all of which are available from Applied Materials, Inc. of Santa Clara, Calif. The particular embodiment of the reactor 100 shown herein is provided for illustrative purposes and should not be used to limit the scope of the disclosure. It is contemplated that the disclosure may be utilized in other plasma processing chambers, including those from other manufacturers.

The reactor 100 comprises a process chamber 102 having a substrate pedestal (e.g., cathode) 124 within a conductive body (wall) 104, and a controller 146. The process chamber 102 has a substantially flat dielectric ceiling or lid 108. The process chamber 102 may have other types of ceilings, e.g., a dome-shaped ceiling. An antenna 110 is disposed above the ceiling 108 and comprises one or more inductive coil elements (two co-axial elements 110a and 110b are shown in FIG. 1). The antenna 110 is coupled through a first matching network 114 to a plasma power source 112, which is typically capable of producing up to about 3000 W at a tunable frequency in a range from about 50 kHz to about 13.56 MHz.

The substrate support pedestal 124 is coupled through a second matching network 142 to a biasing power source 140. The biasing power source 140 provides up to about 500 W of power to the substrate support pedestal 124 at a frequency of approximately 13.56 MHz. The biasing power source 140 is capable of producing either continuous or pulsed power. Alternatively, the biasing power source 140 may be a DC or pulsed DC source.

In one embodiment, the substrate support pedestal 124 comprises an electrostatic chuck 160, which has at least one clamping electrode 132 and is controlled by a chuck power supply 166. In alternative embodiments, the substrate support pedestal 124 may comprise substrate retention mechanisms such as a susceptor cover ring, a mechanical chuck, a vacuum chuck, and the like.

A reticle adapter 182 is used to secure the substrate (e.g., mask or reticle) 122 onto the substrate support pedestal 124. The reticle adapter 182 generally includes a lower portion 184 that covers an upper surface of the substrate support pedestal 124 (for example, the electrostatic chuck 160) and a top portion 186 having an opening 188 that is sized and shaped to hold the substrate 122. The opening 188 is generally substantially centered with respect to the substrate support pedestal 124. The adapter 182 is generally formed from a single piece of etch resistant, high temperature resistant material such as polyimide ceramic or quartz. An edge ring 126 may cover and/or secure the adapter 182 to the substrate support pedestal 124.

A lift mechanism 138 is used to lower or raise the adapter 182 and the substrate 122 onto or off of the substrate support pedestal 124. Generally, the lift mechanism 138 comprises a plurality of lift pins 130 (one lift pin is shown) that travel through respective guide holes 136.

In operation, the temperature of the substrate 122 is controlled by stabilizing the temperature of the substrate support pedestal 124. In one embodiment, the substrate support pedestal 124 comprises a resistive heater 144 and a heat sink 128. The resistive heater 144 generally comprises at least one heating element 134 and is regulated by a heater power supply 168. A backside gas, e.g., helium (He), from a gas source 156 is provided via a gas conduit 158 to channels that are formed in the surface of the substrate support pedestal 124 under the substrate 122 to facilitate heat transfer between the substrate support pedestal 124 and the substrate 122. During processing, the substrate support pedestal 124 may be heated by the resistive heater 144 to a steady-state temperature, which in combination with the backside gas, facilitates uniform heating of the substrate 122. Using such thermal control, the substrate 122 may be maintained at a temperature between about 0 and 350 degrees Celsius (° C.).

An ion-radical shield 170 may be disposed in the process chamber 102 above the substrate support pedestal 124. The ion-radical shield 170 is electrically isolated from the chamber walls 104 and the substrate support pedestal 124 such that no ground path from the shield to ground is provided. One embodiment of the ion-radical shield 170 comprises a substantially flat plate 172 and a plurality of legs 176 supporting the plate 172. The plate 172, which may be made of a variety of materials compatible with process needs, comprises one or more openings (apertures) 174 that define a desired open area in the plate 172. This open area controls the amount of ions that pass from a plasma formed in an upper process volume 178 of the process chamber 102 to a lower process volume 180 located between the ion-radical shield 170 and the substrate 122. The greater the open area, the more ions can pass through the ion-radical shield 170. As such, the size of the apertures 174 controls the ion density in volume 180, and the shield 170 serves as an ion filter. The plate 172 may also comprise a screen or a mesh wherein the open area of the screen or mesh corresponds to the desired open area provided by apertures 174. Alternatively, a combination of a plate and screen or mesh may also be used.

During processing, a potential develops on the surface of the plate 172 as a result of electron bombardment from the plasma. The potential attracts ions from the plasma, effectively filtering them from the plasma, while allowing neutral species, e.g., radicals, to pass through the apertures 174 of the plate 172. Thus, by reducing the amount of ions through the ion-radical shield 170, etching of the mask by neutral species or radicals can proceed in a more controlled manner. This reduces erosion of the resist as well as sputtering of the resist onto the sidewalls of the patterned material layer, thus resulting in improved etch bias and critical dimension uniformity.

Prior to plasma etching, one or more process gases are provided to the process chamber 102 from a gas panel 120, e.g., through one or more inlets 116 (e.g., openings, injectors, nozzles, and the like) located above the substrate support pedestal 124. In the embodiment of FIG. 1, the process gases are provided to the inlets 116 using an annular gas channel 118, which may be formed in the wall 104 or in gas rings (as shown) that are coupled to the wall 104. During the etch process, a plasma formed from the process gases is maintained by applying power from the plasma power source 112 to the antenna 110.

The pressure in the process chamber 102 is controlled using a throttle valve 162 and a vacuum pump 164. The temperature of the wall 104 may be controlled using liquid-containing conduits (not shown) that run through the wall 104. Typically, the chamber wall 104 is formed from a metal (e.g., aluminum, stainless steel, among others) and is coupled to an electrical ground 106. The process chamber 102 also comprises conventional systems for process control, internal diagnostic, end point detection, and the like. Such systems are collectively shown as support systems 154. In one embodiment, Optical Emission Spectra (OES) may be used as an end point detection tool.

The controller 146 comprises a central processing unit (CPU) 150, a memory 148, and support circuits 152 for the CPU 150 and facilitates control of the components of the process chamber 102 and, as such, of the etch process, as discussed below in further detail. The controller 146 may be one of any form of general-purpose computer processor that can be used in an industrial setting for controlling various chambers and sub-processors. The memory, or computer-readable medium of the CPU 150 may be one or more of readily available memory such as random access memory (RAM), read only memory (ROM), floppy disk, hard disk, or any other form of digital storage, local or remote. The support circuits 152 are coupled to the CPU 150 for supporting the processor in a conventional manner. These circuits include cache, power supplies, clock circuits, input/output circuitry and subsystems, and the like. The inventive method discussed below is generally stored in the memory 148 as a software routine. Alternatively, such software routine may also be stored and/or executed by a second CPU (not shown) that is remotely located from the hardware being controlled by the CPU 150.

Figure 2:
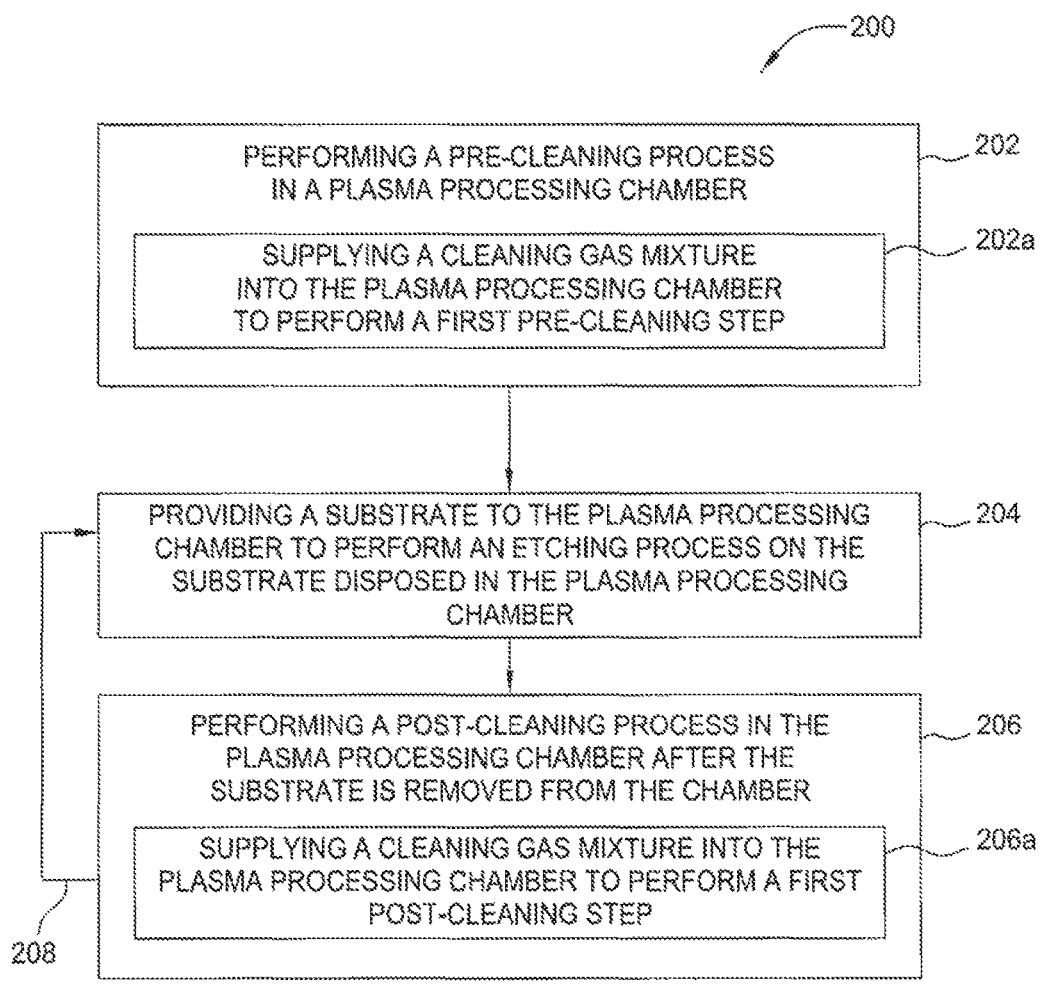
FIG. 2 depicts a flow chart of a method for cleaning a plasma processing chamber according to one embodiment of the disclosure.

FIG. 2 illustrates a method 200 for cleaning a plasma processing chamber, such as the etch reactor 100 depicted in FIG. 1, utilized to perform photomask etching processes. The method 200 includes an in-situ chamber cleaning process according to embodiments of the present disclosure. The method 200 begins at operation 202 by performing a pre-cleaning process in the plasma processing chamber prior to a photomask etching. As the processing chamber 100 may be idled for a period of time, thus, a cleaning process may be performed to remove chamber residual prior to performing an etching process on a photomask substrate as needed. As the interior of the plasma processing chamber, including chamber walls, substrate pedestal, or other components disposed in the plasma processing chamber 100, may have film accumulation or contamination present thereon left over from the previous etching processes, or flakes that have fallen of chamber inner walls while idling, a pre-cleaning process may be performed to clean the interior of the plasma processing chamber prior to providing a substrate into the plasma processing chamber for processing. The pre-cleaning process removes contaminates and/or film accumulated from the interior of the plasma processing chamber, thus preventing unwanted particles from falling on to the substrate disposed on the substrate pedestal during the subsequent etching processes.

In the situation where photomask substrate etching process is consecutively formed on substrates transferred into the processing chamber without long idle time or inactive periods, the pre-cleaning process at operation 202 may be eliminated.

It is noted that the pre-cleaning process at operation 202 may be similar or the same as the post-cleaning process at operation 206, which will be described later in greater detail below. The pre-cleaning process at operation 202 may be optionally performed as needed based on process cleanliness requirement and/or processing chamber component conditions.

While performing the pre-cleaning process at operation 202, no substrate is present in the processing chamber 100, e.g., in absence of a substrate disposed therein. The pre-cleaning process is primarily performed to clean chamber components or inner wall/structures in the processing chamber 100. In some cases, a dummy substrate, such as a clean quartz substrate without film stack disposed thereon, may be disposed in the processing chamber to protect the surface of the substrate pedestal as needed.

In one example, the pre-cleaning process includes a sub-operation 202a, as shown in FIG. 2, to supplying a cleaning gas mixture to perform the pre-cleaning process. In the sub-operation 202a, a cleaning gas mixture may be supplied into the plasma processing chamber to clean the interior of the plasma processing chamber. The cleaning gas mixture includes at least a hydrogen containing gas and an oxygen containing gas. Experimental results indicated that the hydrogen and oxygen elements from the cleaning gas mixture assist reacting with metal contaminates, such as aluminum fluoride ($AlF_3$), removing the metal contaminates from the interior of the plasma processing chamber.

In one embodiment, the hydrogen containing gas as used in the cleaning gas mixture may be selected from a group consisting of $H_2O$, $H_2$, $HCl$, $CH_4$, and the like. The oxygen containing gas may be selected from a group consisting of $O_2$, $H_2O$, $N_2O$, $NO_2$, $O_3$, $CO$, $CO_2$ and the like. In one example, the hydrogen containing gas supplied in the cleaning gas mixture is $HCl$ and the oxygen containing gas supplied in the cleaning gas mixture is $O_2$.

During sub-operation 202a, several process parameters may be controlled. In one embodiment, the RF source power (i.e., an inductively coupled plasma) may be supplied to the plasma processing chamber between about 50 Watt and about 500 Watt, such as about 300 Watts. The RF source power may be applied to the processing chamber with or without RF bias power. The pressure of the processing chamber may be controlled at a relatively low pressure, such as less than 2 milliTorr, between about 0.01 milliTorr and about 1.5 milliTorr, such as about less than 1 milliTorr. It is believed that the low pressure control during the cleaning process may enable the spontaneity of cleaning reaction. The process temperature, e.g., a chamber inner wall temperature, is also controlled at a relatively high temperature range, such as greater than 50 degrees Celsius, such as between about 60 degrees and above, for example above 80 degrees Celsius. In another example, the process temperature may be controlled at between about 90 degrees Celsius and about 110 degrees Celsius.

The hydrogen containing gas supplied in the cleaning gas mixture may be supplied into the processing chamber at a flow rate between about 1 sccm and about 1000 sccm, for example about 100 sccm. The oxygen containing gas supplied in the cleaning gas mixture may be supplied into the processing chamber at a flow rate between about 1 sccm to about 500 sccm, for example about 25 sccm. In one embodiment, the hydrogen containing gas and the oxygen containing gas supplied in the cleaning gas mixture is supplied at a ratio between about 1:1 to about 10:1, such as between about 2:1 and about 6:1, for example about 4:1. It is believed that high flow ratio of hydrogen containing gas to the oxygen containing gas during the cleaning process provides a high amount of hydrogen elements that reacts with the fluorine elements in the aluminum fluoride. The process at operation 202a may be performed between about 10 seconds and about 7200 seconds, based on amount of the contaminants accumulated in the processing chamber.

It is noted that the pre-cleaning process at operation 202 is performed to clean the interior of the plasma processing chamber prior to a substrate etching process being performed. This pre-cleaning process at operation 202 may also be performed as a post-cleaning process at operation 206 to clean the processing chamber 100 after the etching process at operation 204 is completed. In some embodiments, since a substrate etching process is not yet performed in the plasma processing chamber and the metal containing materials, e.g., often found after an etching process, may not yet be formed or accumulated on the interior of the processing chamber, the pre-cleaning process at operation 202 may be eliminated as needed.

Figure 3A:
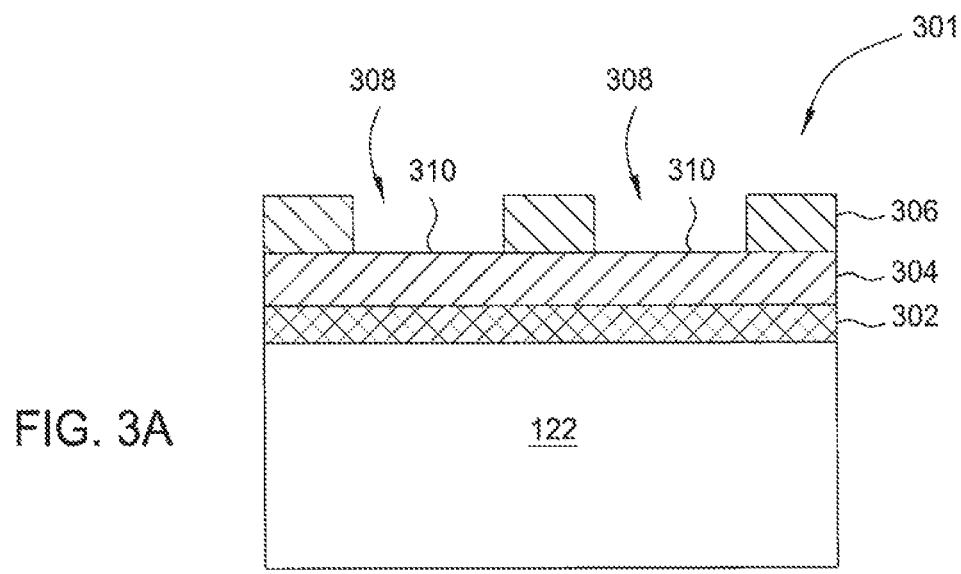
FIG. 3A-3B depicts sectional views of one embodiment of an structure disposed on a substrate at different stages of manufacture.

At operation 204, after the pre-cleaning process is performed in the plasma processing chamber, a substrate, such as the substrate 122 depicted in FIG. 3A, may be provided into the plasma processing chamber 100 for etching. In one embodiment, the substrate 122 to be etched may include an optically transparent silicon based material, such as quartz (i.e., silicon dioxide, $SiO_2$). In the exemplary embodiment depicted in FIG. 3A, the substrate 122 may be a quartz substrate (i.e., low thermal expansion silicon dioxide ($SiO_2$)) layer. The substrate 122 has a rectangular shape having sides between about 5 inches to about 9 inches in length. The substrate 122 may be between about 0.15 inches and about 0.25 inches thick. In one embodiment, the substrate 101 is about 0.25 inches thick.

A film stack 301 disposed on the substrate 122 that may be utilized to form desired features (i.e., openings 308) in the film stack 301. Although the method 200 is described below with reference to a substrate utilized to fabricate a photomask, the method 200 may also be used to advantage in other photomask etching or any etching application. The film stack 301 includes an absorber layer 304 defined by the patterned photoresist layer 306 having portions 310 of the absorber layer 304 exposed by the patterned photoresist layer 306 readily for etching. In one embodiment, a phase shift mask layer 302 may be disposed between the substrate 122 and the absorber layer 304.

In one embodiment, the absorber layer 304 may be a metal containing layer, e.g., a chromium containing layer, such as a Cr metal, chromium oxide ($CrO_x$), chromium nitride (CrN) layer, chromium oxynitride (CrON), or multilayer with these materials, as needed. The phase shift mask layer 302 may be a molybdenum containing layer, such as molybdenum (Mo), molybdenum silicide, molybdenum silicon (MoSi), molybdenum silicon oxynitride ($MoSi_xN_yO_z$) layer or multiple layers, such as multiple pairs of molybdenum and silicon layers. The patterned photoresist layer 306 is then formed over the absorber layer 304 having openings 308 formed therein that expose portions 310 of the absorber layer 304 for etching.

After the substrate 122 is positioned in the plasma processing chamber, an etching process at operation 204 is then performed to etch the absorber layer 304 through the openings 308 defined by the patterned photoresist layer 306. During the etching process, one or more process gases are introduced into the plasma processing chamber 100 to etch the absorber layer 304, such as a Cr containing layer. Exemplary process gases used to supply to the etching gas mixture may include chlorine containing gas, such as chlorine ($Cl_2$), silicon tetrachloride ($SiCl_4$), hydrochloride (HCl), an oxygen-containing gas, such as $O_2$, CO, or $CO_2$, and/or an inert gas for etching the absorber layer 304, such as the Cr containing materials.

Several process parameters may be controlled during the plasma etching substrate process. In one embodiment, the microwave power may be supplied to the plasma processing chamber between about 50 Watt and about 1500 Watt, such as about 400 Watts. The pressure of the processing chamber may be controlled at between about 0.5 milliTorr and about 500 milliTorr, such as between about 0.5 milliTorr and about 2.0 milliTorr, for example about 8 milliTorr, or about 1 milliTorr. The processing gas supplied in the etching gas mixture may be controlled at a flow rate between about 1 sccm to about 1000 sccm, for example about 80 sccm. The process at operation 204 may be performed between about 1 seconds and about 1500 seconds.

Figure 3B:
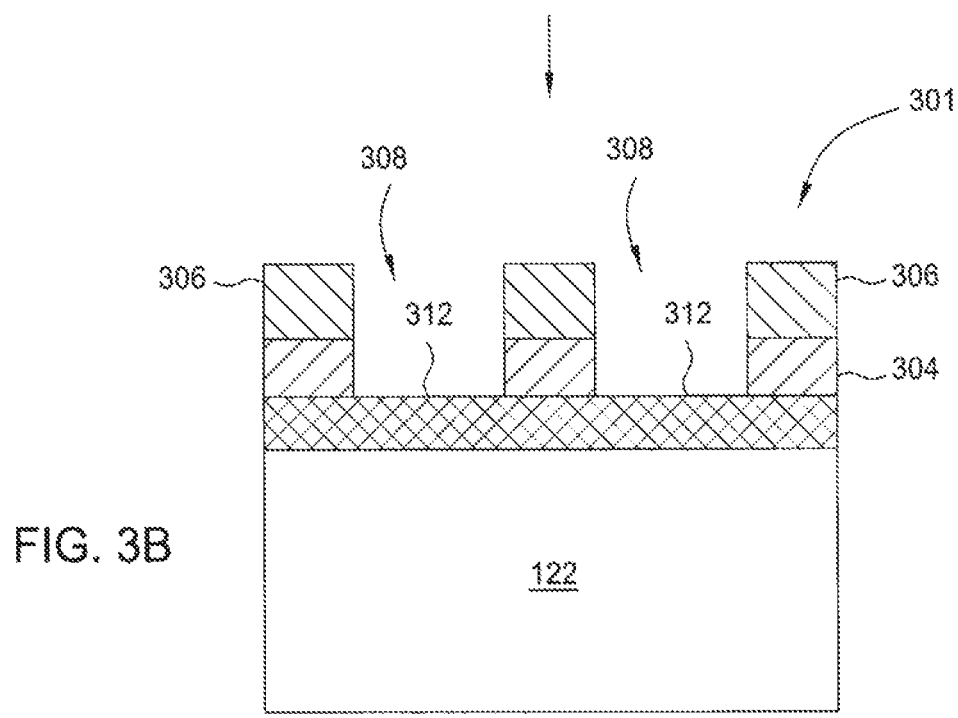

After the absorber layer 304 is etched away, exposing a surface 312 of the underlying phase shift mask layer 302, as shown in FIG. 3B, the etching process at operation 204 is considered completed and terminated.

At operation 206, a post cleaning process is performed. As discussed above, the post cleaning process may be similar to the pre-cleaning at operation 202. The post cleaning process at operation 206 also includes a sub-operation 206a to supplying the cleaning gas mixture, similar to or the same as the cleaning gas mixture supplied at operation 202, to clean the interior of the processing chamber 100. The post cleaning process may be performed for between about 10 seconds and about 1500 seconds. When performing the post-cleaning process, similar to the operation 202 for the pre-cleaning process, no substrate is present in the processing chamber 100, e.g., in absence of a substrate disposed therein. The post-cleaning process is primarily performed to remove etching residuals and byproducts to clean chamber components or inner wall/structures in the processing chamber 100 prior to performing another cycle of the etching process at operation 204. In some cases, a dummy substrate, such as a clean quartz substrate without film stack disposed thereon, may be disposed in the processing chamber to protect the surface of the substrate pedestal as needed.

As discussed above, the cleaning gas mixture at sub-operation 206a is similar to or the same as the cleaning gas mixture at sub-operation 202a to perform the post-cleaning process. It is noted that the etching process at operation 204 and the post-cleaning process may be repeatedly performed, as indicated by the loop 208, until a desired number of the substrates are proceeded in the processing chamber 100 and the processing chamber 100 is cleaned as needed.

Accordingly, methods and apparatus for performing an in-situ cleaning process are provided to clean a plasma processing chamber without breaking vacuum. The methods includes an optional pre-cleaning process and/or a post-cleaning process utilizing a hydrogen containing gas and an oxygen containing gas with low pressure control to clean a plasma processing chamber prior to and after a plasma photomask etching process. The cleaning process may efficiently remove the residuals, re-deposits and film layer with different types of materials, including material contaminates and carbon containing contaminates, from the interior of the plasma processing chamber, thereby maintaining the plasma processing chamber in a desired clean condition and producing high quality photomask without particular pollution.

While the foregoing is directed to embodiments of the present disclosure, other and further embodiments of the disclosure may be devised without departing from the basic scope thereof, and the scope thereof is determined by the claims that follow.

The invention claimed is:

1. A method for in-situ chamber cleaning after an etching process, comprising:
   supplying a cleaning gas mixture including at least an oxygen containing gas and a hydrogen containing gas into a processing chamber in which the etching process was performed on a substrate comprising Cr containing material;
   controlling a processing pressure at less than 2 millitorr;
   applying a RF source power to the processing chamber to form a plasma from the cleaning gas mixture; and
   cleaning the processing chamber in the presence of the plasma.

2. The method of claim 1, further comprising:
   removing the substrate from the processing chamber after the etching process is completed prior to supplying the cleaning gas mixture.

3. The method of claim 1, the hydrogen containing gas is selected from a group consisting of HCI, $H_2O$, $H_2$ and $CH_4$.

4. The method of claim 1, wherein the oxygen containing gas is selected from a group consisting of $O_2$, $H_2O$, $N_2O$, $NO_2$, $O_3$, CO and $CO_2$.

5. The method of claim 1, wherein the hydrogen containing gas and the oxygen containing gas are supplied at a flow ratio of between about 1:1 to about 10:1.

6. The method of claim 1, further comprising:
   maintaining a chamber wall surface temperature above 80 degrees Celsius during cleaning.

7. The method of claim 1, wherein the metal material is etched by a gas mixture including a chlorine containing gas and an oxygen containing gas.

8. The method of claim 1, wherein the hydrogen containing gas is HCI and the oxygen containing gas is $O_2$.

9. The method of claim 1, wherein the substrate is a photomask.

10. The method of claim 1, wherein cleaning the processing chamber further comprises:
    removing aluminum fluoride from the processing chamber.

11. The method of claim 1, wherein the cleaning gas is supplied in the processing chamber in the absence of a substrate disposed in the processing chamber.

12. A method for in-situ chamber cleaning, comprising:
    performing an etching process on a substrate comprising a Cr containing material provided in a processing chamber;
    removing the substrate from the processing chamber;
    performing a cleaning process in the processing chamber by supplying a cleaning gas mixture including at least an oxygen containing gas and a hydrogen containing gas into the processing chamber;
    controlling a processing pressure at less than 2 millitorr; and
    removing metal residuals from the processing chamber using the cleaning gas mixture.

13. The method of claim 12, wherein the metal residuals include aluminum fluoride.

14. The method of claim 12, wherein the hydrogen containing gas is HCI and the oxygen containing gas is $O_2$.

15. The method of claim 12, further comprising:
    maintaining a process chamber pressure of less than 2 milliTorr while performing the cleaning process.

16. A method of an in-situ chamber cleaning process, comprising:
    performing a cleaning process in a processing chamber after a Cr containing metal etching process is performed in the processing chamber, wherein the cleaning process is performed by supplying a cleaning gas mixture including at least an oxygen containing gas and a hydrogen containing gas into the processing chamber;
    controlling a processing pressure at less than 2 millitorr; and
    removing metal residuals from the metal etching process from the processing chamber.

* * * * *